(12) United States Patent
Hsu et al.

(10) Patent No.: US 12,382,598 B2
(45) Date of Patent: Aug. 5, 2025

(54) LIFTING MECHANISM AND DISPLAY DEVICE HAVING THE SAME

(71) Applicant: Qisda Corporation, Taoyuan (TW)

(72) Inventors: Nien-Tsung Hsu, Taoyuan (TW); Han-Kuang Ho, Taoyuan (TW); Hsin-Hung Lin, Taoyuan (TW); Po-Yen Wu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 289 days.

(21) Appl. No.: 18/105,201

(22) Filed: Feb. 2, 2023

(65) Prior Publication Data
US 2024/0008203 A1    Jan. 4, 2024

(30) Foreign Application Priority Data

Jun. 29, 2022    (CN) .......................... 202210757362.X

(51) Int. Cl.
*H05K 5/02*     (2006.01)
*F16M 11/04*    (2006.01)
*F16M 11/18*    (2006.01)

(52) U.S. Cl.
CPC ......... *H05K 5/0234* (2013.01); *F16M 11/046* (2013.01); *F16M 11/18* (2013.01); *F16M 2200/025* (2013.01)

(58) Field of Classification Search
CPC .... H05K 5/0234; F16M 11/046; F16M 11/18; F16M 2200/025; F16M 2200/027; F16M 11/24; F16M 11/10; F16M 2200/048; F16M 11/04; F16M 11/16

USPC ...................... 248/646, 648, 917–920, 122.1
See application file for complete search history.

(56) References Cited

U.S. PATENT DOCUMENTS

| | | | |
|---|---|---|---|
| 7,641,159 B2* | 1/2010 | Kim | H04N 9/3141 248/176.3 |
| 7,775,487 B2* | 8/2010 | Hu | F16M 11/2021 248/346.06 |
| 7,780,125 B2* | 8/2010 | Yen | F16M 11/10 248/920 |
| 8,659,884 B2* | 2/2014 | Segar | F16M 11/22 361/679.22 |
| 9,416,911 B2* | 8/2016 | Segar | F16M 13/02 |
| 12,175,829 B2* | 12/2024 | Barbour | F16M 11/105 |

(Continued)

FOREIGN PATENT DOCUMENTS

CN           203797277 U       8/2014

*Primary Examiner* — Muhammad Ijaz

(57) ABSTRACT

A lifting mechanism and a display device having the same are provided. The lifting mechanism is suitable for being arranged in a supporting stand of the display device. The lifting mechanism comprises a lifting base, a stopping component disposed in the lifting base, a triggering component movably connected to the lifting base, and an elastic component connected to the lifting base and the stopping component. When the triggering component is driven to drive the stopping component, the stopping component moves to press against an inner wall of the supporting stand so that the lifting base is fixedly positioned in the supporting stand. When the triggering component is driven to release the stopping component, the stopping component moves away from the inner wall of the supporting stand by a restoring force of the elastic component so that the lifting base can be lifted of lowered in the supporting stand.

17 Claims, 6 Drawing Sheets

(56) References Cited

U.S. PATENT DOCUMENTS

| | | | |
|---|---|---|---|
| 2008/0225472 A1* | 9/2008 | Chih | F16M 11/24 |
| | | | 361/679.04 |
| 2011/0233350 A1* | 9/2011 | Burgess | F16M 11/2014 |
| | | | 248/123.11 |
| 2012/0187056 A1* | 7/2012 | Hazzard | A47B 21/0314 |
| | | | 248/231.71 |
| 2013/0146728 A1* | 6/2013 | Ergun | A47B 21/02 |
| | | | 248/299.1 |

* cited by examiner

LIFTING MECHANISM AND DISPLAY DEVICE HAVING THE SAME

This application claims the benefit of People's Republic of China application Serial No. 202210757362.X, filed on Jun. 29, 2022, the subject matter of which is incorporated herein by reference.

BACKGROUND OF THE INVENTION

Field of the Invention

The invention relates in general to a lifting mechanism, and more particularly to a lifting mechanism that is applicable to a display device.

Description of the Related Art

In current display devices with the lifting function, when there are objects additionally mounted or placed on the display screen of the display device, the display screen will easily slide down and cannot be suspended, causing the problem about a failure of the suspending function. Thus, it is inconvenient for users to place a headset, a video camera or a screen hanging lamp on such display devices. Therefore, there is a need for a new display device to address the above problem.

SUMMARY OF THE INVENTION

In view of the above, the present disclosure provides a lifting mechanism and a display device having the same to address the problem existing in the prior art.

According to an aspect of the present disclosure, a lifting mechanism suitable for being arranged in a supporting stand of a display device is provided. The lifting mechanism comprises a lifting base, a stopping component, a triggering component and an elastic component. The stopping component is disposed in the lifting base. The triggering component is movably connected to the lifting base. The elastic component is connected to the lifting base and the stopping component. In response to that the triggering component is driven to drive the stopping component, the stopping component moves to press against an inner wall of the supporting stand so that the lifting base is fixedly positioned in the supporting stand. In response to that the triggering component is driven to release the stopping component, the stopping component moves away from the inner wall of the supporting stand by a restoring force of the elastic component so that the lifting base is allowed to be lifted of lowered in the supporting stand.

According to another embodiment of the present disclosure, a display device is provided. The display device comprises a display screen, a supporting stand and a lifting mechanism. The supporting stand includes a slide rail and a constant-force extension component. The lifting mechanism comprises a lifting base, a stopping component, a triggering component and an elastic component. The lifting base is disposed on the slide rail and connected to the display screen and the constant-force extension component. The constant-force extension component provides a supporting force enough to carry a weight of the display screen. The constant-force extension component provides a supporting force enough to carry a weight of the display screen. The stopping component is disposed in the lifting base. The triggering component is movably connected to the lifting base. The elastic component is connected to the lifting base and the stopping component. In response to that the triggering component is driven to drive the stopping component, the stopping component moves to press against an inner wall of the supporting stand so that the lifting base is fixedly positioned in the supporting stand, whereby the lifting mechanism is allowed to carry a load in addition to the weight of the display screen. In response to that the triggering component is driven to release the stopping component, the stopping component moves away from the inner wall of the supporting stand by a restoring force of the elastic component so that the lifting base is allowed to be lifted of lowered in the supporting stand.

Compared with the prior art, the lifting mechanism and the display device having the lifting mechanism provided by the present disclosure can achieve that the display screen without an additional load is able to be suspended relative to the supporting stand in a first state (i.e., a free state) of the lifting mechanism, and can also achieve that the display screen with an additional load is able to be suspended relative to the supporting stand in a second state (i.e., a locked state) of the lifting mechanism. As such, the lifting mechanism and the display device having the lifting mechanism provided by the present disclosure can address the problem in the prior art about a failure of the suspending function.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
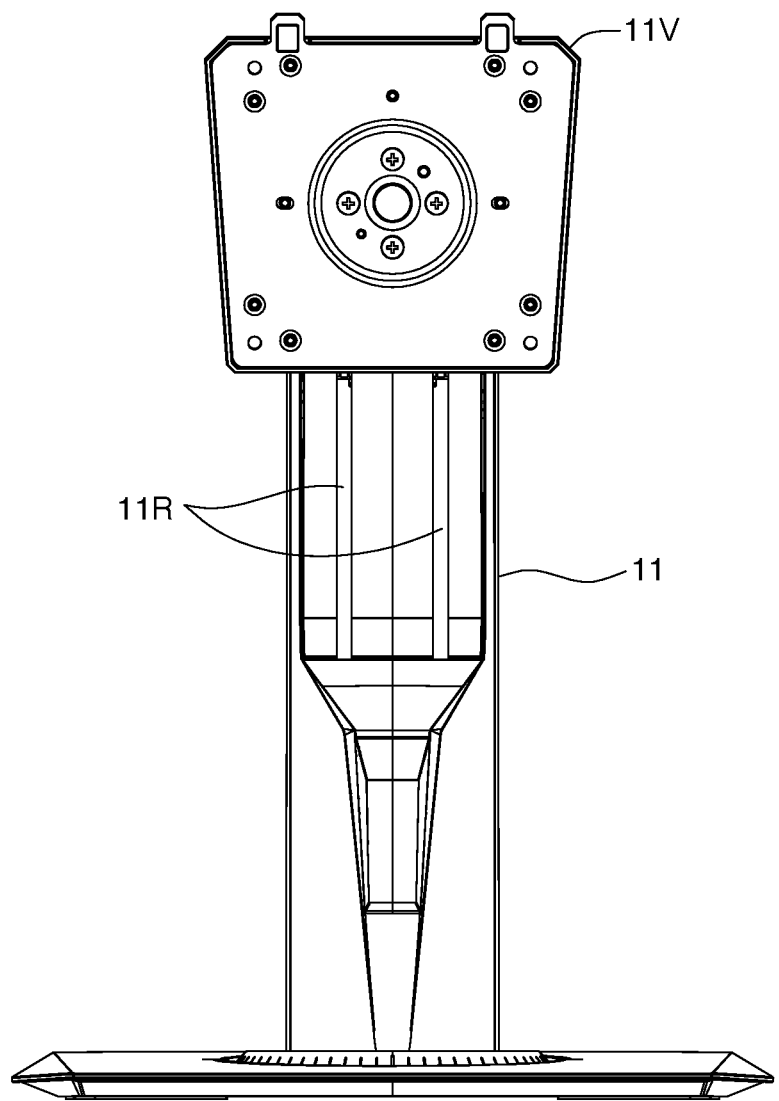
FIG. 1 shows a schematic drawing of a display device according to an embodiment of the present disclosure.
Figure 2:
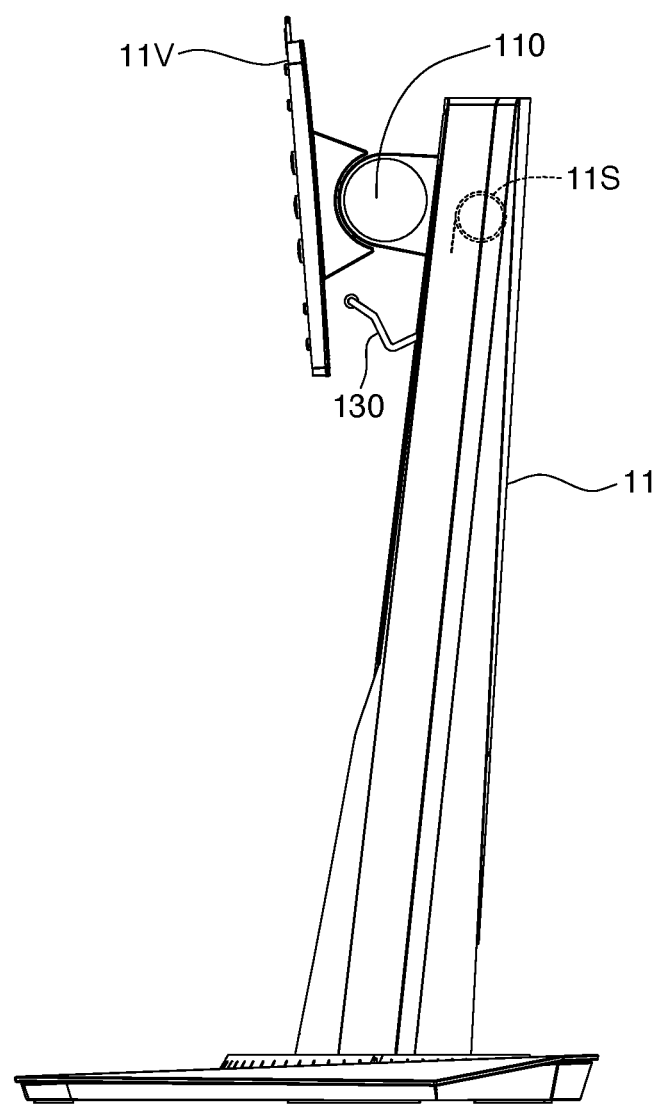
FIGS. 2 and 3 show side views of the display device according to the embodiment of the present disclosure.
Figure 3:
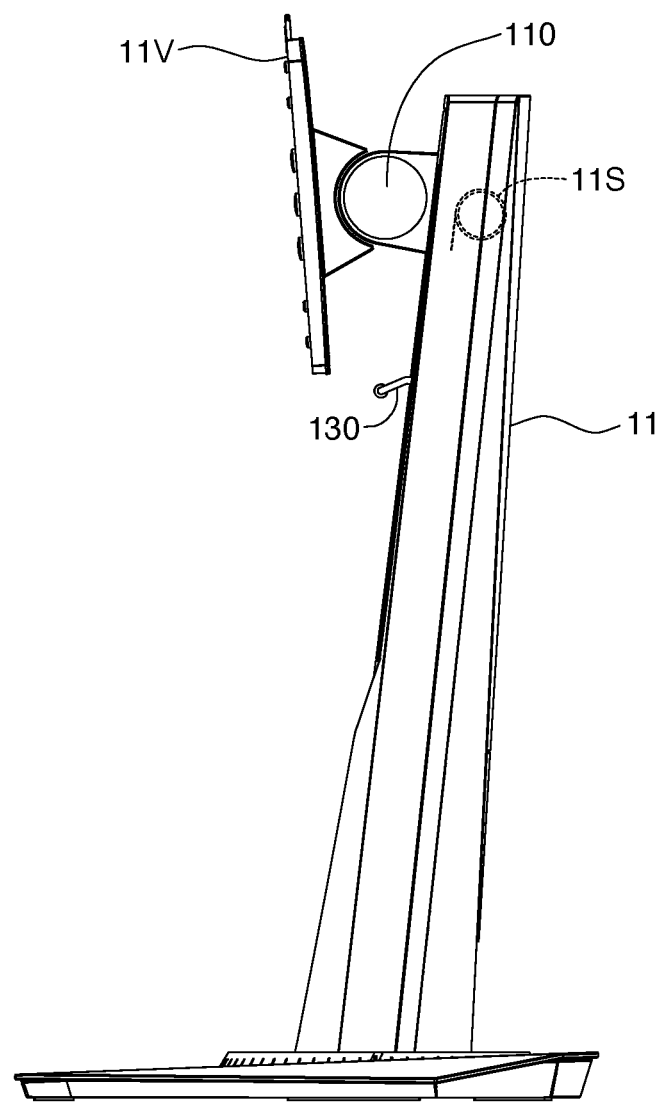

Please refer to FIGS. 1, 2 and 3. FIG. 1 shows a schematic drawing of a display device 10 according to an embodiment of the present disclosure. FIGS. 2 and 3 show side views of the display device 10 according to the embodiment of the present disclosure.

The display device 10 provided according to the present disclosure may be, but is not limited to, a display monitor for a desktop computer. The display device 10 comprises a supporting stand 11 and a display screen (not shown in figures) that may be connected to a connection interface 11V of the supporting stand 11. For example, the connection interface 11V is a VESA standard interface. The supporting stand 11 includes a slide rail 11R. The display screen may be slid along a path of the slide rail 11R in a longitudinal direction to change its position so that a user can adjust the display screen to a best viewing position. The supporting stand 11 further includes a constant-force extension component 11S. The constant-force extension component 11S may be, but is not limited to, a constant-force spring. The constant-force extension component 11S provides a supporting force sufficient to carry a weight of the display screen so that the display screen can be positioned at multiple positions on the path of the slide rail 11R rather than sliding down to the bottom. It should be noted that the constant-force extension component 11S is merely sufficient to carry the weight of the display screen. If an additional load is applied on the display screen, the display screen may slide down along the path of the slide rail 11R. Therefore, the display device 10 provided in the embodiment of the present disclosure further comprises a lifting mechanism.

Figure 4:
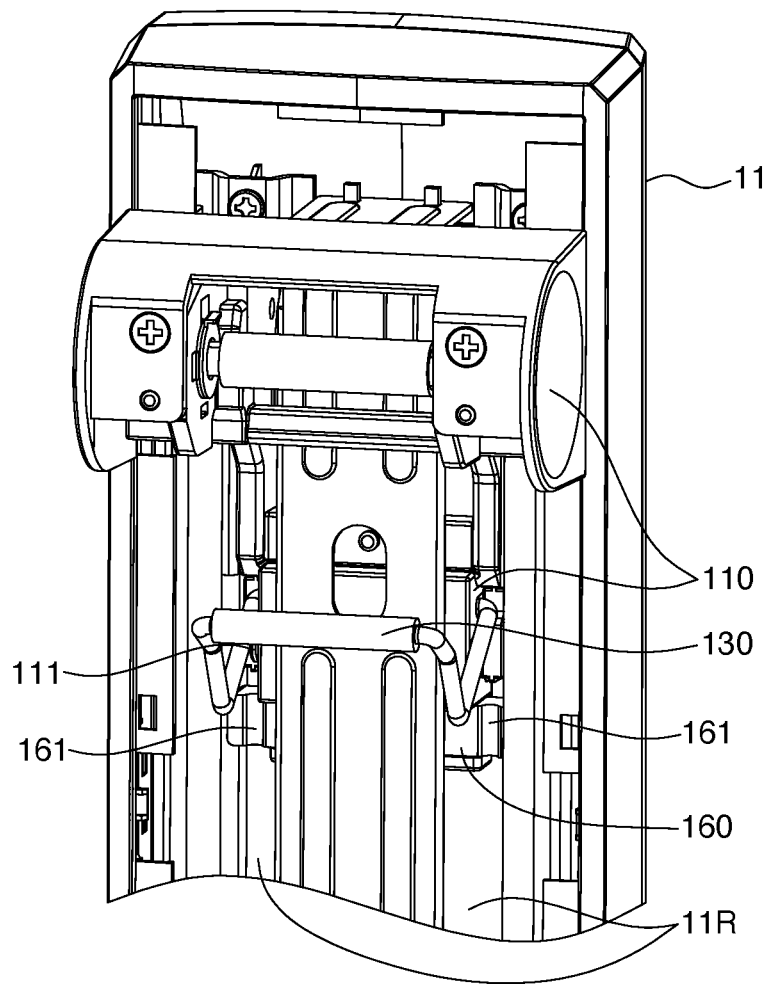
FIG. 4 partially shows a schematic drawing of a lifting mechanism of the display device being in a first state.
Figure 5:
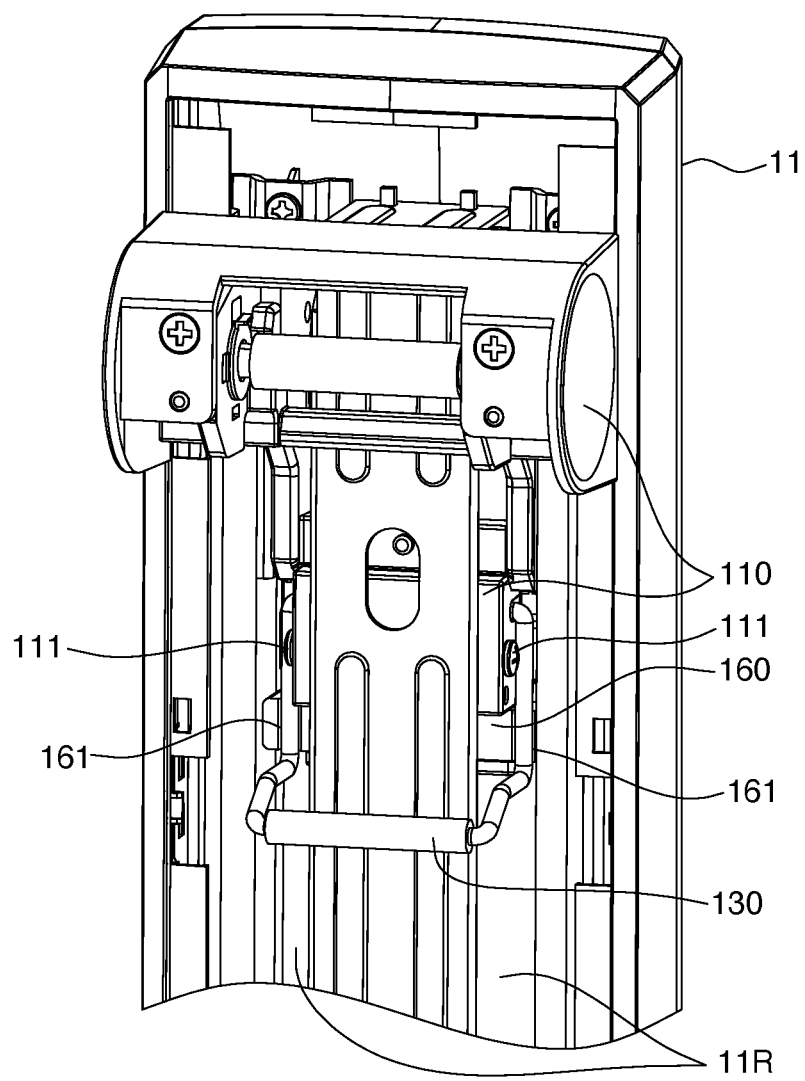
FIG. 5 partially shows a schematic drawing of the lifting mechanism of the display device being in a second state.
Figure 6:
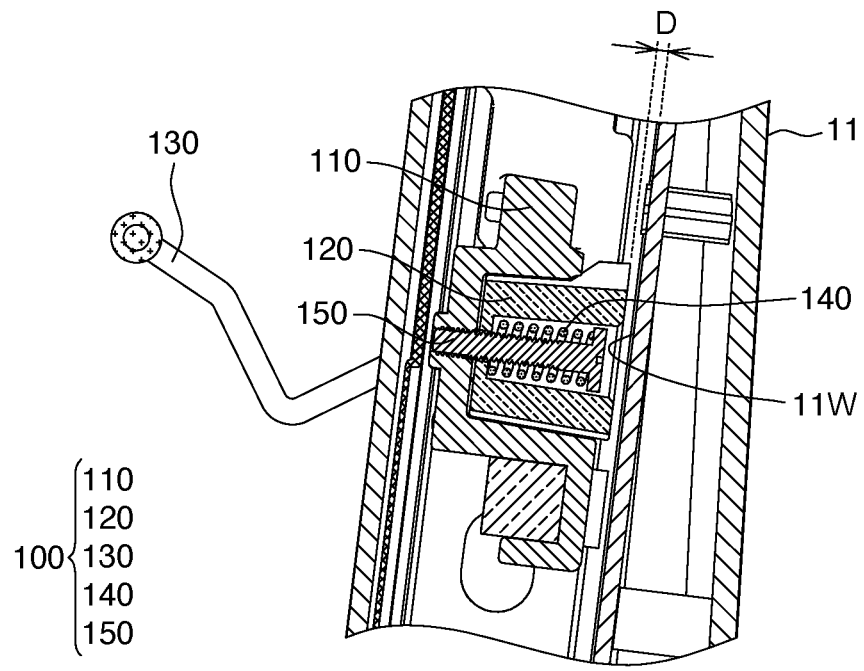
FIG. 6 shows a perspective drawing of the lifting mechanism of the display device being in the first state.
Figure 7:
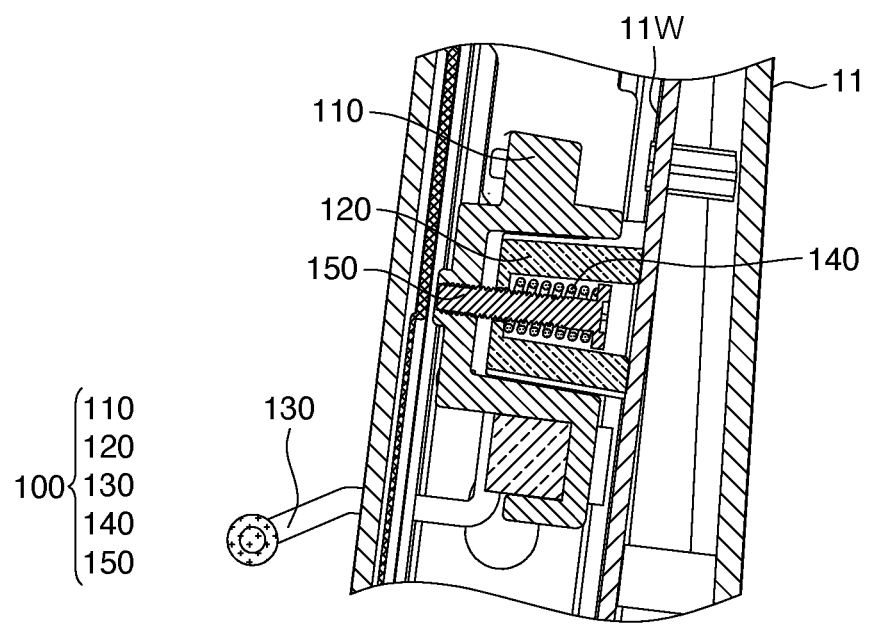
FIG. 7 shows a perspective drawing of the lifting mechanism of the display device being in the second state.

Please refer to FIGS. 4, 5, 6 and 7. FIG. 4 partially shows a schematic drawing of a lifting mechanism 100 of the display device 10 being in a first state. FIG. 5 partially shows a schematic drawing of the lifting mechanism 100 of the display device 10 being in the second state, wherein in order to clearly illustrate the structural arrangement of the lifting mechanism 100, the aforementioned connection interface 11V is omitted in FIGS. 4 and 5. FIG. 6 shows a perspective drawing of the lifting mechanism 100 of the display device 10 being in a first state. FIG. 7 is a perspective drawing of the lifting mechanism 100 of the display device 10 being in a second state.

In order to cope with that a load supported by the supporting stand 11 exceeds the weight of the display screen, such as when there are other objects (such as a headset, a video camera or a screen hanging lamp, etc.) on the display screen, the display device 10 is further provided with a lifting mechanism 100. As such, the display screen with the additional load can be suspended at multiple positions on the path of the slide rail 11R. The lifting mechanism 100 is disposed in the supporting stand 11 and is able to be lifted of lowered. The lifting mechanism 100 mainly comprises a lifting base 110, a stopping component 120, a triggering component 130 and an elastic component 140.

The lifting base 110 is disposed on the slide rail 11R and is connected to the constant-force extension component 11S. The lifting base 110 is connected to the display screen through the connection interface 11V, wherein the connection interface 11V is preferably pivotally connected to the lifting base 110 so that the display screen is rotatable relative to the supporting stand 11 to change the angle of a display surface of the display screen. The triggering component 130 is movably connected to the lifting base 110. As shown in FIGS. 2 and 3, the triggering component 130 may be exposed from the supporting stand 11 for a user to drive and trigger, so as to switch the lifting mechanism 100 between a first state and a second state different from the first state. In an embodiment, the triggering component 130 may have a handle portion with a soft material, so as to provide a user with a better hand feeling. In another embodiment, the triggering component 130 is connected to the lifting base 110 in a detachable or non-detachable manner. A detachable triggering component 130 not only provides an appearance integrity of the supporting stand 11 when the detachable triggering component 130 is removed, but also prevents the lifting mechanism 100 from being unexpectedly switched from the locked state to the free state due to the accidental driving of the triggering component 130.

FIGS. 2, 4 and 6 correspond to the first state of the lifting mechanism 100, namely the lifting mechanism 100 is in a free state. In this free state, the lifting mechanism 100 may carry the weight of the display screen through the setting of the constant-force extension component 11S so that the position of the display screen will not be lowered. FIGS. 3, 5 and 7 correspond to the second state of the lifting mechanism 100, namely the lifting mechanism 100 is in a locked state. When the constant-force extension component 11S solely cannot carry the weight of the display screen and an additional load applied on the display screen, the lifting mechanism 100 may be switched to the locked state to prevent the position of the display screen from being lowered. How the locked state of the lifting mechanism 100 can make the display screen with an additional load be suspended will be described below.

As shown in FIG. 6, the lifting mechanism 100 is in the first state, the triggering component 130 is farther away from the supporting stand 11, and the stopping component 120 is disposed in the lifting base 110 and is separated with the inner wall 11W of the supporting stand 11 by a distance D. This condition corresponds to the aforementioned free state of the lifting mechanism 100, namely the display screen without any object mounted may slide up and down to be suspended at any position of the path of the slide rail 11R.

As shown in FIG. 7, if the display screen has an additional load (such as a headset, a video camera, or screen hanging lamp, etc.) applied on, the display screen will be pulled down. The triggering component 130 presses against and drives the stopping component 120. For example, the triggering component 130 is pivotally connected to the lifting base 110 for being driven to pivotally drive the stopping component 120. Then, the stopping component 120 moves by the distance D to press against the inner wall 11W of the supporting stand 11. As such, the friction force provided by the stopping component 120 in close contact with the supporting stand 11 and the structural engagement provided by the arrangement of the stopping component 120 in the lifting base 110 can switch the lifting mechanism 100 to the locked state, whereby the display screen with an additional weight can be suspended. In other words, in response to that the triggering component 130 is driven to drive the stopping component 120, the stopping component 120 moves to press against the inner wall 11W of the supporting stand 11 so that the lifting base 110 is fixedly positioned in the supporting stand 11, whereby the lifting mechanism 100 is allowed to carry a load in addition to the weight of the display screen. In an embodiment, a pressing portion of the stopping component 120 for pressing against the inner wall 11W of the supporting stand 11 may be provided with a felt material or a flannel material to further increase the friction force between the stopping component 120 and the inner wall 11W, thereby stabilizing the suspension of the display screen.

Further, when the lifting mechanism 100 is desired to be switched from the locked state to the free state, the triggering component 130 may be pulled upward to release the stopping component 120, and the elastic component 140 (such as can be but not limited to a spring) is connected to the lifting base 110 and the stopping component 120 to provide a restoring force for the stopping component 120 to reset the position so that the stopping component 120 moves toward the lifting base 110 and away from the inner wall 11W of the supporting stand 11 until the stopping component 120 returns to the state where the stopping component 120 is separated with the inner wall 11W of the supporting stand 11 by the distance D as shown in FIG. 6. In other words, in response to that the triggering component 130 is driven to release the stopping component 120, the stopping component 120 moves away from the inner wall 11W of the supporting stand 11 by the restoring force of the elastic component 140 so that the lifting base 110 is allowed to be lifted of lowered in the supporting stand 11. As described above, the lifting mechanism 100 can be switched between the free state and the locked state by driving the triggering component 130 so as to achieve that the position of the display screen is able to be lifted of lowered and that the display screen can be suspended. Especially, in the locked state of the lifting mechanism 100, a display screen with an additional load can be suspended. In an embodiment, the display device 10 of the present disclosure can support an additional load of about 2 kilograms (kg) through the lifting mechanism 100.

In addition, as shown in FIGS. 6 and 7, the lifting mechanism 100 further comprises a fastening component 150. The fastening component 150 is, but not limited to, a screw component. An end of the fastening component 150 is connected to the lifting base 110. The elastic component 140 is arranged around the fastening component 150. One end of the elastic component 140 abuts against the fastening component 150, and the other end of the elastic component 140 is fixed with the stopping component 120. As such, the fastening component 150 may be connected between the lifting base 110, the stopping component 120 and the elastic component 140 to provide the positioning of the internal configuration.

Further, as shown in FIGS. 4 and 5, protruding portions 111 may be provided on both sides of the lifting base 110. When the triggering component 130 is driven to drive the stopping component 120, the triggering component 130 passes through the protruding portion 111 and is limited between the protruding portion 111 and the stopping component 120. In other words, when the lifting mechanism 100 is in the locked state, the protruding portions 111 can limit the triggering component 130 in the supporting stand 11 to provide a fixation, thereby preventing the triggering component 130 from being accidentally driven to switch the lifting mechanism 100 to the free state then the lifting base 110 descends unexpectedly. In addition, the protruding portions 111 can provide a fine feedback of hand feeling when the triggering component 130 passes, and thus a user can confirm that the lifting mechanism 100 has completed the switching between the free state and the locked state. Moreover, when the lifting mechanism 100 is switched from the locked state to the free state, namely when the triggering component 130 is driven to release the stopping 120, the triggering component 130 passes through the protruding portion 111 and abuts against the protruding portion 111. As such, the arrangement of the protruding portions 111 can provide a parking place for the triggering component 130 when the lifting mechanism 100 is in a free state, thereby preventing the triggering component 130 from being accidentally driven to unexpectedly switch the lifting mechanism 100 to the locked state then the lifting base 110 cannot be fluently lifted of lowered in the supporting stand 11.

In addition, as shown in FIGS. 4 and 5, the lifting mechanism 100 further comprises a positioning platform 160. The positioning platform 160 is connected to the lifting base 110 and may be lifted and lowered synchronously with the lifting base 110. The positioning platform 160 may include a groove 161. When the triggering component 130 is driven to drive the stopping component 120, the triggering component 130 is fixedly positioned in the groove 161. Specifically, the triggering component 130 and the groove 161 may be magnetic, and the triggering component 130 may be magnetically fixed in the groove 161 so as to further limit the activity of the triggering component 130 in the locked state of the lifting mechanism 100, thereby preventing the lifting mechanism 100 from being unexpectedly switched from the locked state to the free state due to the accidental driving of the triggering component 130.

In conclusion, the display device having the lifting mechanism provided by the present disclosure can achieve that the display screen without the additional load is able to be suspended relative to the supporting stand in a first state (i.e., the free state) of the lifting mechanism, and can also achieve that the display screen with the additional load is able to be suspended relative to the supporting stand in the second state (i.e., the locked state) of the lifting mechanism. As such, the lifting mechanism and the display device having the lifting mechanism provided by the present disclosure can address the problem in the prior art about a failure of the suspending function.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A lifting mechanism suitable for being arranged in a supporting stand of a display device, comprising:
    a lifting base, provided with a protruding portion;
    a stopping component disposed in the lifting base;
    a triggering component movably connected to the lifting base; and
    an elastic component connected to the lifting base and the stopping component;
    wherein in response to that the triggering component is driven to drive the stopping component, the stopping component moves to press against an inner wall of the supporting stand so that the lifting base is fixedly positioned in the supporting stand,
    wherein when the triggering component is driven to drive the stopping component, the triggering component passes through the protruding portion and is limited between the protruding portion and the stopping component, and
    wherein in response to that the triggering component is driven to release the stopping component, the stopping component moves away from the inner wall of the supporting stand by a restoring force of the elastic component so that the lifting base is allowed to be lifted of lowered in the supporting stand.

2. The lifting mechanism according to claim 1, further comprising:
    a fastening component, wherein an end of the fastening component is connected to the lifting base, the elastic component is arranged around the fastening component, one end of the elastic component abuts against the fastening component, and the other end of the elastic component is fixed with the stopping component.

3. The lifting mechanism according to claim 1, wherein when the triggering component is driven to release the stopping component, the triggering component passes through the protruding portion and abuts against the protruding portion.

4. The lifting mechanism according to claim 1, wherein the triggering component is pivotally connected to the lifting base for being driven to pivotally drive the stopping component.

5. The lifting mechanism according to claim 1, further comprising:
    a positioning platform connected to the lifting base, wherein the positioning platform includes a groove, and after the triggering component is driven to drive the stopping component, the triggering component is fixedly positioned in the groove.

6. The lifting mechanism according to claim 5, wherein the triggering component and the groove are magnetic, and the triggering component is magnetically fixed in the groove.

7. The lifting mechanism according to claim 1, wherein the lifting base is connected to a display screen of the display device.

8. The lifting mechanism according to claim 1, wherein a pressing portion of the stopping component for pressing against the inner wall of the supporting stand is provided with a felt material or a flannel material.

9. The lifting mechanism according to claim 1, wherein the triggering component is detachable from the lifting base.

10. A display device, comprising:
   a display screen;
   a supporting stand including a slide rail and a constant-force extension component; and
   a lifting mechanism comprising:
      a lifting base disposed on the slide rail and connected to the display screen and the constant-force extension component, wherein the constant-force extension component provides a supporting force sufficient to carry a weight of the display screen;
      a stopping component disposed in the lifting base;
      a triggering component movably connected to the lifting base; and
      an elastic component connected to the lifting base and the stopping component;
      wherein in response to that the triggering component is driven to drive the stopping component, the stopping component moves to press against an inner wall of the supporting stand so that the lifting base is fixedly positioned in the supporting stand, whereby the lifting mechanism is allowed to carry a load in addition to the weight of the display screen,
      wherein the lifting base is provided with a protruding portion, and when the triggering component is driven to drive the stopping component, the triggering component passes through the protruding portion and is limited between the protruding portion and the stopping component, and
      wherein in response to that the triggering component is driven to release the stopping component, the stopping component moves away from the inner wall of the supporting stand by a restoring force of the elastic component so that the lifting base is allowed to be lifted of lowered in the supporting stand.

11. The display device according to claim 10, wherein the lifting mechanism further comprises:
   a fastening component, wherein an end of the fastening component is connected to the lifting base, the elastic component is arranged around the fastening component, one end of the elastic component abuts against the fastening component, and the other end of the elastic component is fixed with the stopping component.

12. The display device according to claim 10, wherein when the triggering component is driven to release the stopping component, the triggering component passes through the protruding portion and abuts against the protruding portion.

13. The display device according to claim 10, wherein the triggering component is pivotally connected to the lifting base for being driven to pivotally drive the stopping component.

14. The display device according to claim 10, wherein the lifting mechanism further comprises:
   a positioning platform connected to the lifting base, wherein the positioning platform includes a groove, and after the triggering component is driven to drive the stopping component, the triggering component is fixedly positioned in the groove.

15. The display device according to claim 14, wherein the triggering component and the groove are magnetic, and the triggering component is magnetically fixed in the groove.

16. The display device according to claim 10, wherein the triggering component is exposed from the supporting stand.

17. The display device according to claim 10, wherein a pressing portion of the stopping component for pressing against the inner wall of the supporting stand is provided with a felt material or a flannel material.

* * * * *